United States Patent

[11] 3,573,795

[72] Inventors John O. Bowers, Jr.;
Larry Nordstrom, Seminole, Fla.
[21] Appl. No. 710,798
[22] Filed Mar. 6, 1968
[45] Patented Apr. 6, 1971
[73] Assignee General Dynamics Corporation

[54] SYSTEMS FOR CONVERTING INFORMATION FROM DIGITAL-TO-ANALOG FORM AND VICE VERSA
6 Claims, 6 Drawing Figs.

[52] U.S. Cl. .......... 340/347
[51] Int. Cl. .......... H03k 13/04, H03k 13/17
[50] Field of Search .......... 340/347; 235/150.5, 150.51, 150.52, 150.53

[56] References Cited

UNITED STATES PATENTS

| | | | |
|---|---|---|---|
| 3,015,815 | 1/1962 | Mann | 340/347 |
| 3,016,528 | 1/1962 | Villars | 340/347 |
| 3,067,940 | 12/1962 | Preston | 235/150.5 |
| 3,264,637 | 8/1966 | Parkinson | 340/347 |
| 3,277,464 | 10/1966 | Naydan et al. | 340/347 |
| 3,298,017 | 1/1967 | Avignon et al | 340/347 |
| 3,305,857 | 2/1967 | Barber | 340/347 |
| 3,400,257 | 9/1968 | Smith | 235/150.52 |
| 3,354,452 | 11/1967 | Bard et al. | 340/347 |
| 3,386,090 | 5/1968 | Gatti et al. | 340/347 |

*Primary Examiner*—Maynard R. Wilbur
*Assistant Examiner*—Gary R. Edwards
*Attorney*—Martin Lu Kacher

ABSTRACT: High speed systems for nonlinear digital-to-analog and analog-to-digital conversion. The systems include a nonlinear analog signal generator which generates analog signals having amplitudes determined by the lower order bits of a digital code and which translates this analog voltage into an output analog voltage which is nonlinearly related to the code and a translation network including a multiplier which multiplies the first mentioned analog voltage by a factor related to the value of the higher order bits of the digital code. Effectively, this changes the slope of linearly variable analog signals generated in response to the lower order bits of the code. For digital-to-analog conversion, a digital control system responsive to the bits of a digital code operates the nonlinear signal generator to provide an analog voltage corresponding to the value of the digital code. For analog-to-digital conversion, a comparator responsive to the output analog voltage from the generator changes the code presented by the digital control systems and by successive approximations obtains the code which corresponds to the value of an input analog system.

INVENTORS
JOHN O. BOWERS, JR.
LARRY NORDSTROM

BY M. LuKacher ATTY

INVENTORS
JOHN O. BOWERS, JR
LARRY NORDSTROM

BY

BY M. Lukacher ATTY

INVENTORS
JOHN O. BOWERS, JR
LARRY NORDSTROM
BY M. L. Kach ATTY

INVENTORS
JOHN O. BOWERS, JR
LARRY NORDSTROM

BY M. [signature] ATTY

SYSTEMS FOR CONVERTING INFORMATION FROM DIGITAL-TO-ANALOG FORM AND VICE VERSA

The present invention relates to systems for converting information which may be in digital form or analog form from one of such forms into the other and particularly to systems for high speed nonlinear digital-to-analog and analog-to-digital conversion.

The invention is especially suitable for pulse code modulated (PCM) transmission and reception systems whereby voice, video or other analog signals may be companded (viz. compressed simultaneously with digital encoding on transmission and expanded simultaneously with decoding on reception) thereby facilitating the handling of analog signals having wide dynamic range. The invention is also applicable generally to analog-to-digital and digital-to-analog conversion systems especially where features of high speed encoding and decoding are desired.

Previous techniques for high speed analog-to-digital conversion and digital-to-analog conversion suffer from several disadvantages, particularly where the digital code and the analog signal are to be related in accordance with a nonlinear function or characteristic. To achieve a continuous nonlinear function such as an approximation of logarithmic function, the forward characteristic of a diode has been used in order to modify the analog signal before encoding and after decoding. In order to achieve a uniform and reproducible output, a temperature regulated oven to control the diode characteristic plus considerable additional circuitry, such as amplifier and over control circuitry have been needed. If some characteristic is desired, such as a good approximation to the nonlinear companding characteristic which is established for telephone systems, special, selected diodes must be used. The diodes at the transmitter must be matched to the diodes at the receiver. A temperature control oven and associated circuitry must also be used. The size, weight and power consumption of the oven and its associated circuits make the use of a diode to obtain the nonlinear encoding and decoding characteristics undesirable in many applications where size, weight and power consumption must be minimized, say for example in space and military communication systems.

Other characteristics for encoding nonlinear related digital or analog information also include unstable devices similar to the diode mentioned above, such for example as a variable frequency oscillator which is modulated over the encoding interval with a voltage that varies in time in accordance with the desired nonlinear function. Even where linear encoding and decoding techniques are used, the encoding or decoding speeds obtained are limited as by requiring encoding or decoding of effectively longer bit lengths during each interval in order to obtain the requisite nonlinear characteristic.

It is also desirable that the encoder or decoder be made adaptable to provide a wide range of nonlinear encoding or decoding characteristics. Known techniques for nonlinear encoding or decoding, such as mentioned above, are limited to a particular characteristic and must be carefully redesigned in order to function in accordance with any other characteristic.

Accordingly, it is an object of the present invention to provide improved systems for encoding and decoding information from analog-to-digital form and vice versa which are capable of high resolution, accuracy and speed.

It is a further object of the present invention to provide improved systems for encoding and decoding information between analog and digital forms which are nonlinearly related.

It is a still further object of the present invention to provide an improved high speed, nonlinear digital-to-analog converter which is more accurate and less complex than digital-to-analog converters which have heretofore been available.

It is a still further object of the present invention to provide an improved nonlinear successive approximation analog-to-digital converter which is accurate, simple and is operative at high speed.

It is a still further object of the present invention to provide an improved system for transmission of analog information by encoding the information into PCM data and decoding the PCM data back into analog form which has nonlinear compressor and expander characteristics which are essentially identical to each other and which are compatible with such characteristics as are standard in the telephone industry.

It is a still further object of the present invention to provide improved systems for encoding and decoding information between analog and digital forms in which the above mentioned difficulties and disadvantages are substantially eliminated.

It is a still further object of the present invention to provide improved analog-to-digital conversion systems which interposes little quantizing noise and is therefore especially suitable for voice communications by PCM techniques.

It is a still further object of the present invention to provide improved digital-to-analog and analog-to-digital conversion systems which are highly accurate, operate at high speeds and less complex than systems which have been heretofore been available.

It is a still further object of the present invention to provide improved systems for analog-to-digital and digital-to-analog conversion which are tolerant to variations in temperature, aging of components and the like.

Briefly described, a system for encoding or decoding information from analog-to-digital form or vice versa, in accordance with the invention, includes an analog signal generator which generates an analog output varying in amplitude along any selected segment of different slope of a nonlinear characteristic in accordance with a digital code. Specifically, the generator may include a linear digital-to-analog converter responsive to the lower order bits of the code for generating a first analog signal. A translation network which may comprise a divider across which the first analog signal is applied and gates for selecting outputs from different taps along said divider is operated by the higher order bits of the code to translate the first analog signal into an output analog signal which is nonlinearly related to the value of the code. As the code changes during each encoding or decoding interval, an output analog signal nonlinearly related to the value of the code during each interval is generated. A digital control system, including a comparator in cases where analog-to-digital encoding is desired, provides the code for controlling the nonlinear analog signal generator. The output of the generator is an analog signal related to the value of the code. The polarity of this output may be controlled by the most significant bit of the code. The comparator and timing signals in the digital control system can alter the code until, by successive approximations, the code corresponds to the value of an input analog signal.

In the event that very high digital encoding speed is desired, the encoding system may include a first encoder having a capacity for encoding a signal into all of the bits of a desired bit length output code word. A second encoder having the capacity to encode a plurality of the lower order bits of that code is also provided. The input signal is applied to the second encoder and via a network for delaying the code by one encoding period, to the first encoder. At the end of each such encoding period, the output of the second encoder is transferred to the first encoder. Accordingly, the time for encoding is reduced by the encoding time for the plurality of bits which are encoded in the second encoder, thereby effectively increasing the encoding speed.

The invention itself, both as to its organization and method of operation, as well as additional objects and advantages thereof will become more readily apparent from a reading of the following description in connection with the accompanying drawings in which.

Figure 1:
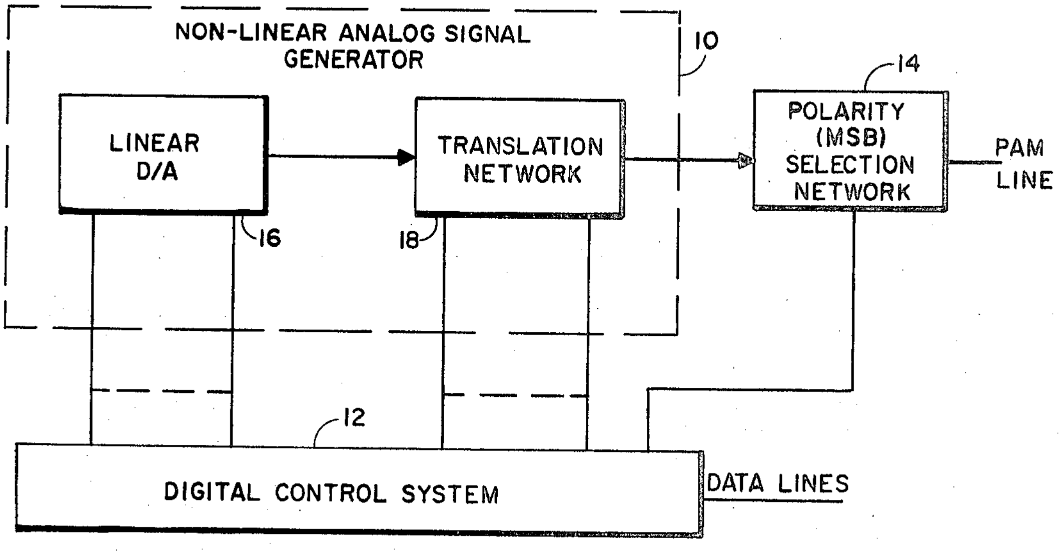
FIG. 1 is a block diagram of a system for encoding and decoding information between analog and digital forms in accordance with the invention.

Referring more particularly to FIG. 1, a system for analog-to-digital or digital-to-analog conversion is shown in general form. Connected to the system is a PAM line for amplitude modulated pulses which may be encoded by the system into the form of digital codes on data lines. Digital information appearing on the data lines may be encoded into PAM analog signals which appear on the PAM line. The system utilizes a nonlinear analog signal generator or converter 10. The converter is controlled by a digital control system 12. For operation as an analog-to-digital converter the digital control system 12 will include a comparator and a timing generator which produces the digital code corresponding to the input analog signal on the PAM line by successive approximations. For digital-to-analog conversion, the code presented to the digital control system 12 is applied to the generator 10 and operates the generator to produce the analog output corresponding to the bits of the code. The most significant bit of the code is applied to a polarity selection network 14 which selects the output polarity of the analog signal. For analog-to-digital conversion, the polarity selection network 14 also operates the digital control system 12 to produce a most significant bit of an output digital code in accordance with the polarity of an input analog signal.

The nonlinear encoding or decoding characteristic is obtained by virtue of the analog signal generator 10. Basically, the analog signal generator contains two components which operate in conjunction to produce the nonlinear coding characteristic; namely, a linear digital-to-analog converter 16 and a translation network 18. The linear digital-to-analog converter 16 is operated by the lower order bits of the code provided by the control system 12 to produce an output which varies linearly with the values of these least significant bits. The higher order bits, excepting the most significant bit, are applied to the translation network 18 to vary the output along any selected segment of the desired nonlinear coding characteristic which is represented by the higher order bits. The translation network includes means for varying the amplitude of the output from the digital-to-analog converter so that it will be in the range of the desired segment of the coding characteristic, together with means for multiplying the output of the linear digital-to-analog converter 16 so as to effectively determine the slope of the segment. As will become more apparent as the description proceeds, the nonlinear characteristic which is produced may be controlled by precision resistors, matched transistors and a temperature compensation device so as to be tolerant of variations in temperatures, aging in components and the like. Inasmuch as the nonlinear analog signal generator 10 for digital-to-analog conversion is identical to the generator which may be used for nonlinear analog-to-digital conversion, the analog signal which is encoded and thereafter decoded will also be substantially identical, thereby making the system especially suitable for use in voice communication systems, such as telephone carrier PCM systems. Also, the coding characteristic produced by the generator 10 may have a large number of segments of different slope, thereby permitting any desired continuous nonlinear function to be approximated to a high degree of accuracy.

Figure 2:
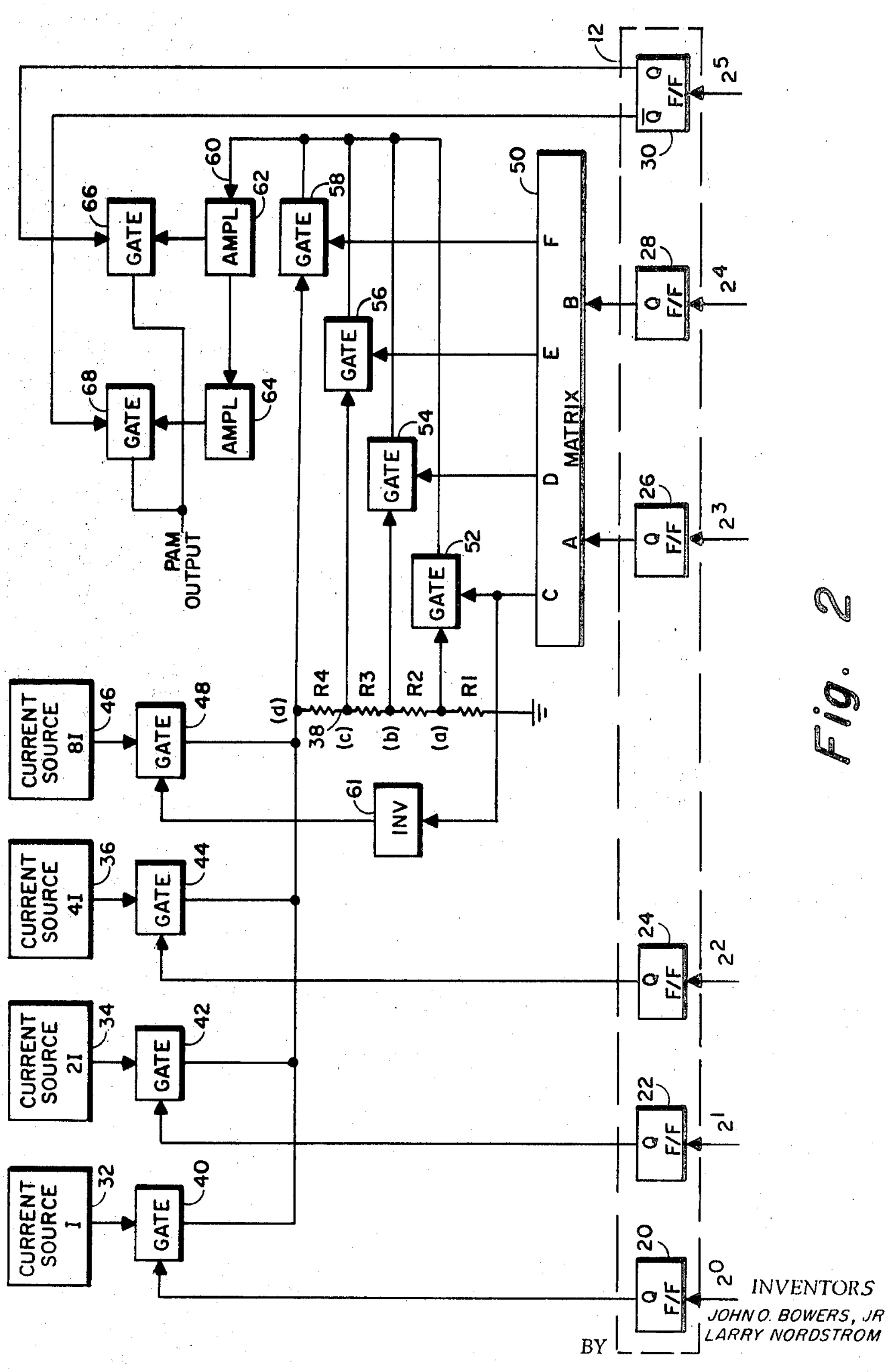
FIG. 2 is a block diagram of a nonlinear analog signal generator which may be used in the system of FIG. 1.

Referring to FIG. 2, the digital control system 12 is represented as a register having a plurality of flip-flop stages 20, 22, 24, 28 and 30. The flip-flop 30 stores the most significant bit of the code, a different code being presented to the register during each encoding interval. The least significant bits $2^0$, $2^1$ and $2^2$ are stored in the flip-flops 20, 22 and 24. These are applied to the linear digital-to-analog converter which consists of three current sources 32, 34 and 36 which feed a precision resistor divider 38 having sections of resistances $R_1$, $R_2$, $R_3$ and $R_4$. The current sources will be considered as producing currents having values which are binarily related. Thus, the current source 32 is considered to produce a value $I$, while the current sources 34 and 36 produce currents having values $2I$ and $4I$. $R_2$ is considered to have a value three times $R_1$, 1, while $R_3$ and $R_4$ have values 12 times $R_1$ and 48 times $R_1$ respectively. Thus the voltages at tap points (*a*), (*b*), (*c*) and (*d*) are binarily related. The current sources 32, 34 and 36 are switch connected to the divider 38 by gates 40, 42 and 44 respectively. Thus, with a constant current flowing through the divider, the voltage to ground at point (*b*) is four times the voltage to ground at point (*a*). The voltage to ground at point (*c* ) is 16 times the voltage at point (*a*) and the voltage at point (*b*) is 64 times the voltage to ground at point (*a*). Accordingly by selecting the voltages at the different points on the divider 38, the analog output selected by the gates 40, 42 and 44 can be effectively multiplied.

In addition to the three binarily related sources 32, 34, and 36, a bias current source 46 is provided for selecting the initial point for each of the segments of the coding characteristic. Only one bias source is used in the system illustrated in FIG. 2, since the starting points of each segment are binarily related. Of course, different bias sources may be used if such binary relationship is not desired. The bias current source has a value of 8I and is applied to the divider 38 via a gate 48.

The translation network 10 includes a transcoding matrix 50 which may be a diode matrix having two inputs A and B, and four outputs C, D, E, and F. The matrix is operated by the $2^3$ and $2^4$ bits stored in flip-flops 26 and 28 and in accordance with techniques known in the art and is therefore not described in detail.

TABLE I

| Inputs | | Outputs | | | |
|---|---|---|---|---|---|
| A | B | C | D | E | F |
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

Figure 4:
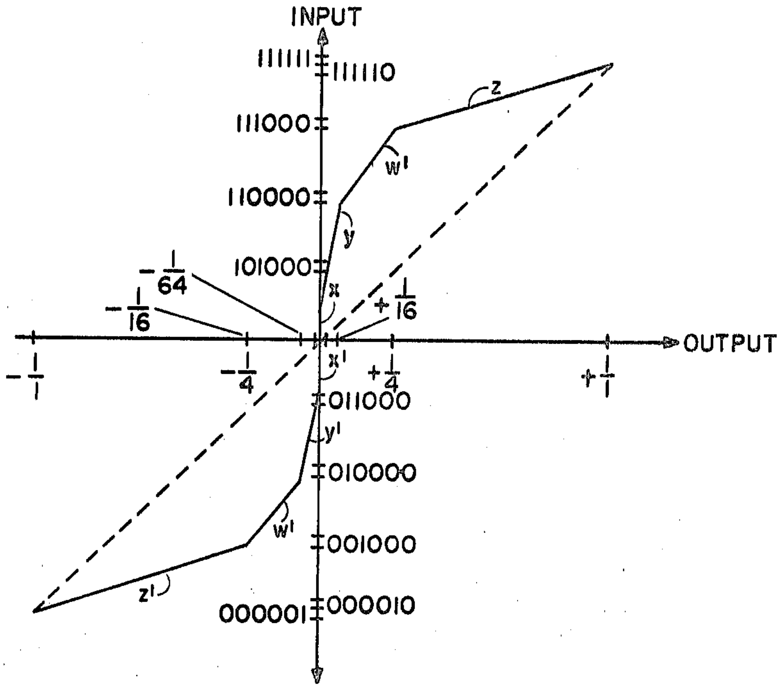
FIG. 4 is a plot of the nonlinear encoding and decoding characteristic of the generator shown in FIGS. 2 and 3.

The matrix outputs C, D, E and F control analog gates 52, 54, 56 and 58 respectively so as to select the slopes of the coding characteristic by switching, to a common output line 60, the voltage at any selected one of the points (*a*), (*b*), (*c*) or (*d*). The matrix output at C is applied to the bias current gate 48 via an inverter 61. The coding characteristic is shown in FIG. 4 as having four segments of different slopes in each of the first and third quadrants. The switching points between different slopes is shown on the ordinate. Operation along the first slope $x$ or $x'$ is obtained when the $2^3$ and $2^4$ bits are both O. Output C of the matrix is then 1, thereby inhibiting gate 48. The common output line 60 receives the output voltage at point (*a*) via enabled gate 52.

A pair of unity gain converting amplifiers 62 and 64 and gates 66 and 68 respectively associated with the amplifiers 62 and 64 are provided for inverting the polarity of the output on line 60 in accordance with the value of the most significant bit. If the most significant bit as stored in the register of the flip-flop 30 is 1, gate 68 is enabled, while gate 66 is inhibited. The output is therefore inverted twice in the unity gain inverting amplifiers 62 and 64 and appears at the output as a positive voltage. If the most significant $2^5$ bit is 0, gate 66 is enabled, while gate 68 is inverted. The output then passes only through the output amplifier 64 and is inverted in polarity. Accordingly, the PAM output will be in the third quadrant of the coding characteristic (FIG. 4). The output amplifier 64 is desirably a precision amplifier so that the third quadrant characteristic is matched to the first quadrant characteristic. The match between the first and third quadrant characteristics is also assured by virtue of the output voltage being derived from the same generation network at the common output line 60. Operation along the second slopes $y$ or $y'$ results when $2^3$ and $2^4$ bits are 1 and 0 respectively. Then, the gate 48 is enabled shifting the starting point by a voltage equal to four times the voltage across $R_1$, the bottom resistor of the divider 38. The gate 54 is enabled, thereby effectively multiplying the analog voltage produced by any combination of the current sources 32, 34 and 36 by factor of four. The slope along the segment $y$ or $y'$ is therefore changed. Similarily, operation along the segments $u$ and $u'$ and $z$ and $z'$ is obtained by enabling gates 56 and 58 respectively.

Figures 3, 6:
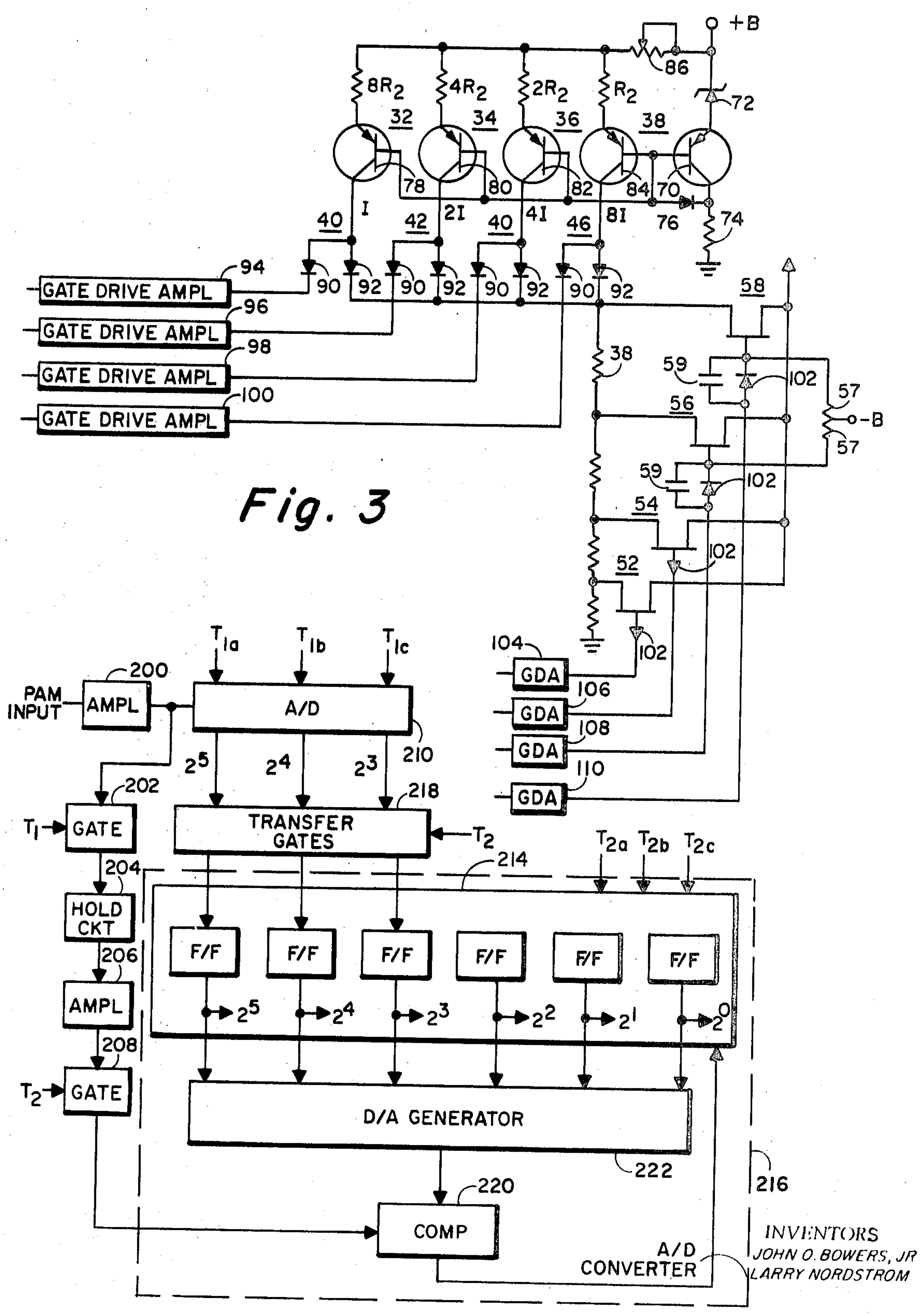
FIG. 3 is a diagram, partially in block form and partially in schematic form showing in greater detail some of the circuits shown in FIG. 2.
FIG. 6 is a block diagram of a high speed analog-to-digital converter in accordance with the invention.

The current sources 32, 34, 36 and 38 and their associated gates 40, 42, 44 and 46 are shown in FIG. 3 in greater detail. Also shown in FIG. 3 is the diver 38 and the circuits of the gates 52, 54, 56 and 58. Constant current and temperature stability is insured by a compensating and stabilizing circuit including a transistor 70 which is emitter connected to a source of operating voltage at +B via a temperature compensating zener diode 72 and collector connected to ground via a resistor 74. A base current return path for the transistor 70 is provided by way of a diode 76. This diode also provides a base current return path to ground for the transistors 78, 80, 82 and 84 in each of the current sources 32, 34, 36 and 38. The current generated by the sources is selected by emitter resistors having values $R_2$, $2R_2$, $4R_2$ and $8R_2$ so that the currents produced by each of the gates will be binarily related. A gain adjusting potentiometer 86 in the path from +B to the current control resistors $R_2$ in each of the gates 32, 34, 36 and 38 may be used for precise adjustment of the currents.

The gates 40, 42, 44 and 46 are diode gates, each including a pair of diodes 90 and 92. The diodes 90 receive control voltages from different gate drive amplifiers 94, 96 and 98 which are respectively input connected to the Q outputs of flip-flops 20, 22 and 24. A gate drive amplifier 100 is connected to the C output of the matrix 50 and may serve as the inverter 62. When the outputs of these amplifiers are of a relatively high positive voltage, say +4 volts, their respective gates will be open, thereby permitting current to flow through the diodes 92. If the gate drive amplifier outputs are at relatively low voltage, say zero volts, the diodes 90 will be conductive and current will flow through the diodes 90 to ground, rather than through the diodes 92 to the matrix 38. The gates therefore will be closed.

The analog gates 50, 52, 54, 56 and 58 are field effect transistors which are gate connected via diodes 102, in the case of *N* channel FET gates 56 and 58 and directly connected in the case of *P* channel FET gates 52 and 54, to the outputs of gate drive amplifiers 104, 106, 108 and 110. Capacitors 59 and resistors 57 which are connected to a negative voltage source at −B permit faster gate operation. These gate drive amplifiers are in turn input connected to the outputs C, D, E and F of the matrix 50. The gate drive amplifiers may provide positive voltage levels in response to input bits having a binary 1 value, thereby rendering the field effect transistors conductive between their sources and their drains. When the gate drive amplifier outputs are negative in polarity, inhibiting voltages will be applied to the gates of the field effect transistors, thereby inhibiting them.

Figure 5:
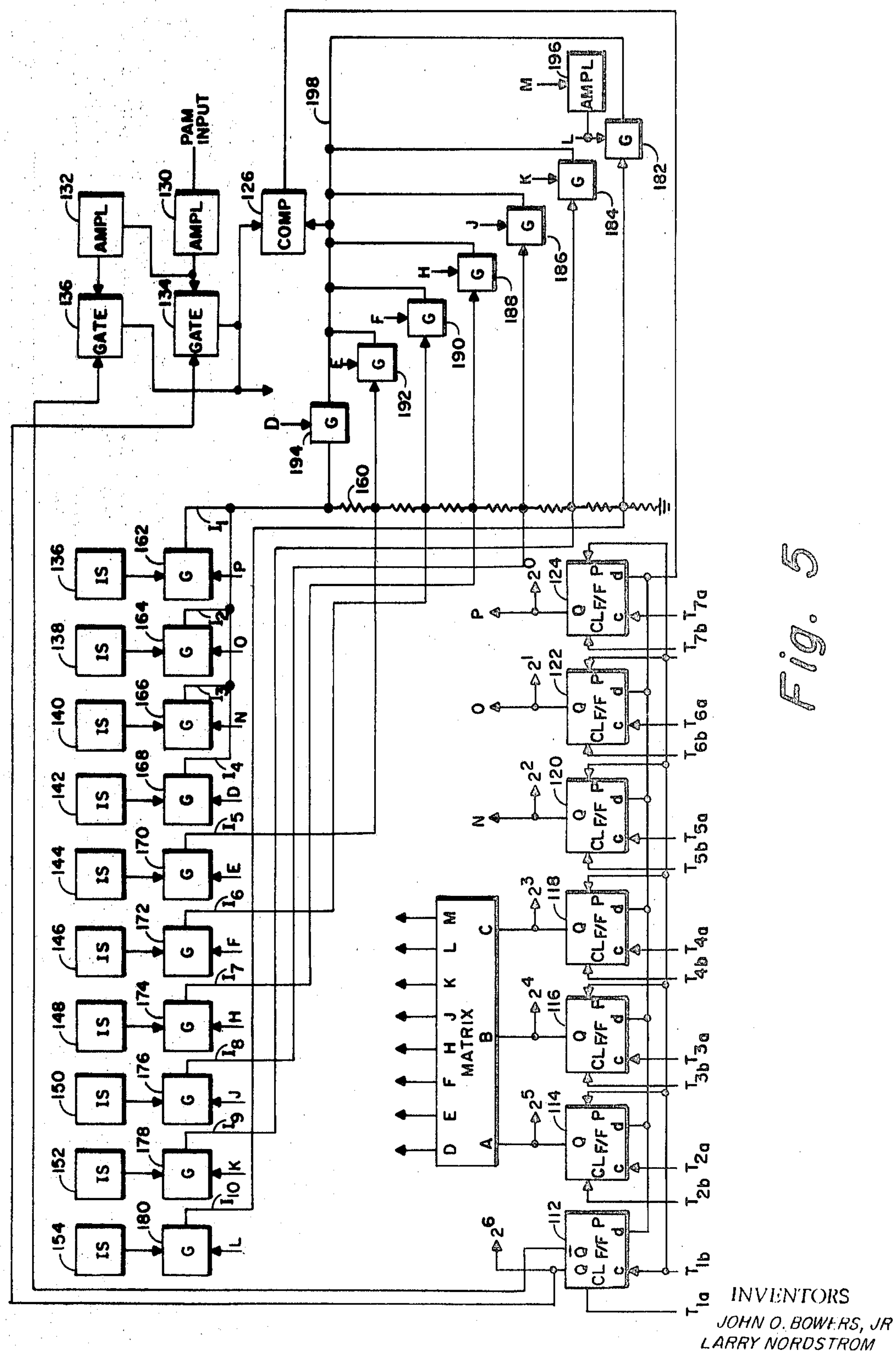
FIG. 5 is a block diagram of a successive approximation analog-to-digital converter embodying the invention.

The digital-to-analog converter shown in FIG. 2 may be used in an analog-to-digital conversion system by the inclusion of a comparator and a timing pulse generator in the digital control system. An analog-to-digital converter using a generator similar to that shown in FIG. 2 will be described in connection with FIG. 5. The system shown in FIG. 5 includes additional current sources and additional resistance elements in its resistor divider 160 in order to code the output along seven segments in each quadrant. Since the first segment in the first and third quadrants are continuous, the characteristic may be considered to have 13 segments overall. The digital control system for the analog-to-digital converter shown in FIG. 5 is in the form of a register containing seven flip-flops. The flip-flop 112 is assigned to the highest order or $2^6$ bit of the digital code which will be stored in the register. The $2^5$, $2^4$, $2^3$, $2^2$, $2^1$ and $2^0$ bits will be respectively stored in flip-flops 114, 116, 118, 120, 122 and 124. These flip-flops may be identical and have four control terminals marked CL, $p$, $c$ and $d$. The output terminals are Q and $\overline{Q}$. These flip-flops are cleared or conditioned to reset state when a pulse is applied to the $p$ input. These flip-flops will switch to set condition upon application of a command to the clock or CL input when a level is applied to the $d$ input. Suitably the flip-flops may be of the type SN15945 manufactured by Texas Instruments, Incorporated of Dallas, Texas.

A timing or sequence generator (not shown) is connected to the CL and $p$ terminals (except for the flip-flop 112) of the flip-flops in the register and a sequence of pulses $T_{1a}$, $T_{1b}$ through $T_{7a}$, $T_{7b}$ is applied in sequence to the flip-flops from the timing generator during each encoding signal. The first pulse applied is $T_{1a}$. This pulse will set the first flip-flop 112 and clear or reset the remaining flip-flops 114, 116, 118, 120, 122 and 124. The register initially will therefore store the binary code 1000000.

The digital-to-analog conversion is accomplished by means of successive approximations. The next pulse after $T_{1a}$ is $T_{1b}$ which is applied to the clock input of the first flip-flop 112 so that the first flip-flop will be reset to 0 if the PAM input amplitude is greater than one-half the maximum value of the code which may be registered in the flip-flops. During each successive bit times, a pulse $T_{2a}$, $T_{3a}$, $T_{4a}$, $T_{5a}$, $T_{6a}$ and $T_{7a}$ will be applied to the CL inputs of successive ones of the flip-flops 114, 116, 118, 120, 122 and 124. During each bit time, a level will be applied to the $d$ inputs of the flip-flops indicating whether or not the code represent a value greater than or less than the PAM input amplitude. If the value is less than the PAM value, a level applied to $d$ input will be operative to reset the flip-flop during its alloted bit time, when the pulses $T_{2b}$ (during the second-bit time), $T_{3b}$ (during the third-bit time), $T_{4b}$ (during the fourth-bit time), $T_{5b}$ (during the fifth-bit time), $T_{6b}$ (during the sixth-bit time), and $T_{7b}$ (during the seventh-bit time) are each applied to its associated flip-flop.

The voltage applied to the $d$ inputs of the flip-flops is obtained from a comparator 126 in the digital control system. The comparator 126 also receives an analog voltage which is generated by a nonlinear digital-to-analog converter which as noted above is similar to the converter shown in FIG. 2. This converter is controlled by the code stored in the register during each bit time. Control levels P, O and N are derived from the flip-flops which store the least significant bits. A transcoding matrix 128 translates the code represented by the next three most significant bits (the $2^3$, $2^4$ and $2^5$ bits) into levels D, E, F, H, J, K, L and M which also control the digital-to-analog converter. The matrix may be 3×8 diode matrix which operates in accordance with the truth table (Table I) set forth below:

TABLE II

| Inputs | | | Outputs | | | | | | | |
|---|---|---|---|---|---|---|---|---|---|---|
| A | B | C | D | E | F | H | J | K | L | M |
| 0 | 0 | 0 | 0 | 0 | 0 | 0 | 0 | 0 | 0 | 1 |
| 0 | 0 | 1 | 0 | 0 | 0 | 0 | 0 | 0 | 1 | 0 |
| 0 | 1 | 0 | 0 | 0 | 0 | 0 | 0 | 1 | 0 | 0 |
| 0 | 1 | 1 | 0 | 0 | 0 | 0 | 1 | 0 | 0 | 0 |
| 1 | 0 | 0 | 0 | 0 | 0 | 1 | 0 | 0 | 0 | 0 |
| 1 | 0 | 1 | 0 | 0 | 1 | 0 | 0 | 0 | 0 | 0 |
| 1 | 1 | 0 | 0 | 1 | 0 | 0 | 0 | 0 | 0 | 0 |
| 1 | 1 | 1 | 1 | 0 | 0 | 0 | 0 | 0 | 0 | 0 |

During the first-bit time, the flip-flop 112 will store a binary 1 bit (its Q output will be high). All of the other flip-flops will be reset. Thus, the control levels to the digital-to-analog converter D, E, F, H, J, K, L, M, N, O, P will be low (representing binary 0 bits). Therefore, the digital-to-analog converter will produce a 0 voltage output level.

The first decision is whether the PAM input is above or below zero voltage, i.e., determination of the polarity of the PAM input. Unity gain amplifiers 130 and 132 the second of which 132 is an inverting amplifier, a pair of gates 134 and 136 similar to the gates 64 and 68 accomplish this comparison. Gate 134 will be enabled, while gate 136 is inhibited. Thus, the PAM input will be applied directly to the comparator 126. If the PAM input is below zero volts, the output of the comparator will be a binary 0 voltage level. The flip-flop 112 will then be reset during the first bit time by the pulse $T_{1b}$. If the PAM input is above zero volts, the comparator 126 output will be a level representing a logical 1. The flip-flop then will not be reset. When the flip-flop 112 remains set, the PAM input to the comparator will continue to be taken from the output of the noninverting unity gain amplifier 130 via the gate 134. However, if the flip-flop 112 is reset at the end of the first-bit time, the PAM input will be taken from the inverting amplifier 132 via the gate 136. The first flip-flop 112 which of course, stores the most significant or $2^6$ bit then will represent the polarity of the PAM input. In the event that a 2's complement code is desired, the most significant bit stored in the flip-flop 112 may be used to control a data inverter logic which complements the bits stored in the other flip-flops 114, 116, 118, 120, 122 and 124 upon readout to the line or other data utilization device. It will be appreciated that the output bits stored in the register may be taken in parallel form, as shown in the drawing from the Q outputs of the flip-flops or translated into serial from for transmission to a line as serial PCM data.

The digital-to-analog converter includes 10 current sources 136, 138, 140, 142, 144, 146, 148, 150, 152 and 154. The first three current sources 136, 138 and 140 are controlled by the lower order bits of the code stored in the register (viz. outputs P, O and N). The currents produced by these sources may be binarily related (viz. $I_3$ is twice $I_2$ and four times $I_1$). The currents $I_4$ through $I_{10}$ obtained from the sources 142, 144, 146, 148, 150, 152 and 154 are not binarily related. These bias currents determine the starting point on each segment of the nonlinear coding characteristic. The current $I_4$ acts in conjunction with the currents $I_5$ through $I_{10}$ to establish the starting points for six successive segments. The first segment starts at the origin and the bias currents are zero over the first segment.

The currents are summed across a divider 160 having seven resistor sections. The values of the resistors in each section are not binarily related so that the slopes of each segment of the coding characteristic are not binarily related. The use of nonlinearly related resistance elements and nonlinearly related bias currents permits the coding characteristic to accurately match a particular logarithmic characteristic known in the telephone art at the $\mu$=100 characteristic. The current source 142 is connected to the top of the divider 160, together with the current sources 136, 138, 140 via their respective gates 162, 164 and 166. Gates 168, 170, 172, 174, 176, 178 and 180 connect the current sources 144, 146, 148, 150, 152 and 154 to successively lower taps along the divider 160. These gates are controlled by the output levels N, O and P from the flip-flops 120, 122 and 124 and the output levels from the matrix 128 D, E, F, H, J, K, L and M. The selection of the slopes of the segments is provided by the translation network including gates 182, 184, 186, 188, 190, 192 and 194 via the outputs from the matrix. The gate 182 receives both the L and M outputs, the M output being applied through a buffer amplifier 186.

The operation of the digital-to-analog converter during the second bit time is as follows: The $T_{2a}$ pulse sets the flip-flop 114. The matrix 128 will then have applied to its A, B and C inputs the bits 100. The matrix then translates this code into the eight bit code shown on the fifth line of Table II wherein the D output will represent a logical 1. Current *I7* from the source 148 will then be applied to the fourth from the bottom tap on the divider 160. Gate 188 will also be enabled and a voltage level which may be considerably less than half of the full scale voltage, which may be generated by the converter, is applied as an input to the comparator 126. If the PAM input is larger than the output from the digital-to-analog converter as obtained at the common output line 198, the comparator output will be a logical 1 and the flip-flop 114 will not be reset during the second bit time by the pulse $T_{2b}$. The digital code corresponding to the PAM input will be obtained during each of the latter bit times by similar successive approximations. As mentioned above, the increments of output voltage from the digital-to-analog converter are not equal. It may be desirable to provide dual sample and hold and gating and inverting circuits similar to the circuits 130, 132, 134 and 136. The sample and hold circuits will be at the input to the amplifiers 130. This will permit higher encoding rates by virtue of successive PAM samples being routed alternatively to different ones of the dual circuits during each word time.

FIG. 6 illustrates an analog-to-digital conversion system having the feature of faster successive approximation encoding speed. The PAM input is applied through an input buffer amplifier 200 to a delay circuit including a gate 202 which may be an analog FET gate and a hold circuit 204 which may be a storage capacitor. The hold circuit may be followed by another buffer amplifier 206 and another gate 208 similar to the gate 202. At the beginning of an encoding period, the PAM input is applied via the gate 202 to the hold circuit 204 upon receipt of a command pulse $I_1$ which is applied to the gate 202. Simultaneously, the PAM input is fed directly into a first analog-to-digital converter 210. Consider that this application that the conversion of the PAM input is through a six-bit code. The analog-to-digital converter 210 may be a conventional successive approximation converter where the three most significant bits are encoded during one word time. At the end of that word time, a pulse $T_2$ from the timing generator transfers the three most significant bits to the flip-flop stages of a register 214 of a second analog-to-digital converter 216 via transfer gates 218 to which the pulse $T_2$ is applied. Simultaneously, the pulse $T_2$ is applied to the gate 208 which applies the PAM input now delayed by one word time to the comparator 220 of the analog-to-digital converter 216. The analog-to-digital converter 216 is a six-bit converter having a digital-to-analog generator 222 controlled by the register 214. Only the three least significant bits remain to be converted into digital form and the latter is accomplished during a one word time. The output from the register may be fed to a shift register (no shown) where it may be serialized. Thus during each word time, the three most significant bits of undelayed PAM signals are encoded in parallel in the first converter 210. The three least significant bits are converted in the parallel with the encoding of the three most significant bits in the six-bit converter 216. Thus, the encoding rate of the system is effectively doubled. It will be appreciated that the analog-to-digital converters may be nonlinear converters similar to those described in connection with FIGS. 1—5 or may be conventional successive approximation converters.

From the foregoing descriptions it will be apparent that there has been provided improved systems for conversion of information from digital-to-analog form or vice versa. The systems may operate in accordance with a nonlinear coding characteristic and may also operate at high speed. While several embodiments of systems in accordance with the invention have been described, for purposes of illustrating the invention, it will be appreciated that variations and modifications thereof in accordance with the invention will undoubtedly be apparent to those skilled in the art. The foregoing description should therefore be taken merely as illustrative and not in any limiting sense

We claim:

1. A converter for providing conversion between analog signals and digital codes which are nonlinearly related to each other, said codes being represented by multibit binary numbers having a plurality of higher order bits and a plurality of lower order bits, said converter comprising:

a. a plurality of current sources;

b. a multistage register for storing the bits of each of said numbers;

c. a plurality of first gate means each separately coupled to the stages of said register which store the lower order bits of said number;

d. a resistor network coupled to the outputs of said gate means for developing a voltage in response to the sum of the currents provided by said sources, said network having a plurality of outputs, each across a different value of resistance presented by said network;

e. a plurality of second gate means each connected between a different one of said plurality of network outputs and an output terminal for said analog signals, said second gate means also having control inputs coupled to the stages of said register which store the higher order bits of said number; and f. at least one further current source and at least one further gate means for connecting said further current source to said network, said further gate means having a control input connected to one of said higher order bit storing stages of said register.

2. The invention as set forth in claim 1 including a plurality selection network connected to said analog signal terminal and to the one of said register stages which stores the highest order bit of said number.

3. The invention as set forth in claim 1 including a transcoding matrix connected to said higher order bit storing stages and to said second gate means for operating different ones of said second gate means separately and in response to different combinations of said higher bits.

4. The invention as set forth in claim 1 wherein said network is a voltage divider having a plurality of taps which provide said network outputs, said taps being separately connected to different ones of said second plurality of gate means.

5. The invention as set forth in claim 1 wherein said current sources each include a transistor having a resistor of different value connected in the emitter-collector path thereof, means for connecting said emitter-collector paths to a common source of operating voltage, another transistor having one of its emitter and collector connected to said source of operating voltage by way of a Zener diode, and the other of its said emitter and collector to a point of reference voltage by way of a resistor, and means connecting the bases of all of the abovementioned transistors to the junction of said resistor and said other transistor.

6. The invention as set forth in claim 1 including a comparator providing an output when the signal amplitude at said terminal exceeds an input signal amplitude and means for selectively connecting said comparator output to different ones of said register stages for changing the values of the bits stored therein in accordance with said comparator outputs.